US010700276B2

United States Patent
Lv et al.

(10) Patent No.: US 10,700,276 B2
(45) Date of Patent: *Jun. 30, 2020

(54) PREPARATION METHOD OF CU-BASED RESISTIVE RANDOM ACCESS MEMORY, AND MEMORY

(71) Applicant: THE INSTITUTE OF MICROELECTRONICS OF CHINESE ACADEMY OF SCIENCES, Beijing (CN)

(72) Inventors: Hangbing Lv, Beijing (CN); Ming Liu, Beijing (CN); Qi Liu, Beijing (CN); Shibing Long, Beijing (CN)

(73) Assignee: THE INSTITUTE OF MICROELECTRONICS OF CHINESE ACADEMY OF SCIENCES, Beijing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 15/744,064

(22) PCT Filed: Apr. 22, 2016

(86) PCT No.: PCT/CN2016/080022
§ 371 (c)(1),
(2) Date: Jan. 12, 2018

(87) PCT Pub. No.: WO2017/181418
PCT Pub. Date: Oct. 26, 2017

(65) Prior Publication Data
US 2018/0205015 A1 Jul. 19, 2018

(51) Int. Cl.
H01L 45/00 (2006.01)
(52) U.S. Cl.
CPC .......... *H01L 45/1266* (2013.01); *H01L 45/08* (2013.01); *H01L 45/085* (2013.01);
(Continued)

(58) Field of Classification Search
None
See application file for complete search history.

(56) References Cited

U.S. PATENT DOCUMENTS 6,046,108 A * 4/2000 Liu ...................... H01L 21/7684
257/E21.583
7,396,759 B1 * 7/2008 van Schravendijk .......................
H01L 21/76834
257/E21.575

(Continued)

FOREIGN PATENT DOCUMENTS

| CN | 101740717 A | 6/2010 |
| CN | 101894907 A | 11/2010 |
| CN | 102044630 A | 5/2011 |

*Primary Examiner* — Khaja Ahmad
(74) *Attorney, Agent, or Firm* — Platinum Intellectual Property LLP

(57) ABSTRACT

The present invention discloses a preparation method of a Cu-based resistive random access memory, and a memory. The preparation method includes: performing composition and a chemical combination treatment on a lower copper electrode (10) to generate a compound buffer layer (40), wherein the compound buffer layer (40) is capable of preventing the oxidation of the lower copper electrode (10); depositing a solid electrolyte material (50) on the compound buffer layer (40); and depositing an upper electrode (60) on the solid electrolyte material (50) to form the memory. In the above technical solution, the compound buffer layer (40) capable of preventing the oxidation of the lower copper electrode (10) is inserted between the lower copper electrode (10) and the solid electrolyte material (50) to efficiently prevent the oxidation of the lower copper electrode (10) in a growth process of the solid electrolyte material (50), such that an electrode interface does not become rough due to the oxidation, thereby solving the technical problem of relatively low reliability and yield of the device resulting from the rough electrode interface of the Cu-based resistive (Continued)

random access memory in the prior art, and thus the reliability and the yield of the device are improved.

9 Claims, 2 Drawing Sheets

(52) U.S. Cl.
CPC ...... *H01L 45/1233* (2013.01); *H01L 45/1273* (2013.01); *H01L 45/142* (2013.01); *H01L 45/144* (2013.01); *H01L 45/16* (2013.01); *H01L 45/1683* (2013.01)

(56) References Cited

U.S. PATENT DOCUMENTS

| | | | |
|---|---|---|---|
| 8,422,295 B1* | 4/2013 | Lin | G11C 14/009 365/185.08 |
| 2007/0197023 A1* | 8/2007 | Widodo | H01L 21/76843 438/627 |
| 2009/0134521 A1* | 5/2009 | Liu | H01L 21/76846 257/762 |
| 2011/0101521 A1* | 5/2011 | Hwang | H01L 23/5329 257/737 |
| 2011/0272664 A1* | 11/2011 | Tada | H01L 27/228 257/4 |

* cited by examiner

PREPARATION METHOD OF CU-BASED RESISTIVE RANDOM ACCESS MEMORY, AND MEMORY

RELATED APPLICATIONS

This application is a United States National Stage Application filed under 35 U.S.C 371 of PCT Patent Application Serial No. PCT/CN2016/080022, filed Apr. 22, 2016, the disclosure of all of which are hereby incorporated by reference in their entirety.

FIELD OF THE INVENTION

The present invention belongs to the technical field of integrated circuit manufacturing, and in particular to a preparation method of a Cu-based resistive random access memory, and a memory.

BACKGROUND OF THE INVENTION

As a novel non-volatile memory technology, the resistive random access memory has attracted a great deal of attention due to its high density, low cost and capability of breaking through the limitations of the technology. The materials used are phase change materials, metal oxide materials, organic materials and the like. A metal bridge type resistive random access memory dominated by Cu ions or Ag ions is one of the main types of resistive devices, and its structure is usually composed of active metal electrodes such as Cu or Ag, solid electrolyte materials (such as chalcogenide materials, metals oxides and the like), and inert electrodes (such as Pt, Pd, Ru, TaN and the like). The mechanism of the metal bridge type resistive random access memory may be described by the redox reaction of Cu or Ag ions. Taking a Cu-based resistive device as an example, during programming, Cu atoms are ionized by an electric field and then are injected into a solid electrolyte material to be reduced to Cu atoms through combination with electrons, and when the metal electrodes on both ends are connected by a Cu metal filament, the resistance state of the device changes from a high resistance state into a low resistance state; and an erasing process is just opposite to the programming process, a metal conducting channel breaks under the action of an external electric field, and the resistance of the device changes from the low resistance state into the high resistance state.

Cu is widely used as an interconnecting wire material in an advanced semiconductor preparation process, and thus the Cu-based resistive random access memory may be integrated in a back end preparation process of a standard CMOS process easily. The solid electrolyte material is usually a metal oxide and is grown on the Cu electrode by sputtering or thermal oxidation and other methods. However, in the growth process, due to the presence of oxygen, the surface of the Cu electrode is easily oxidized to roughen the electrode interface, resulting in problems of low reliability and low device yield.

SUMMARY OF THE INVENTION

The embodiment of the present invention provides a preparation method of a Cu-based resistive random access memory, and a memory. The technical problems of relatively low reliability and device yield of the Cu-based resistive random access memory in the prior art are solved.

The embodiment of the present application provides a preparation method of a Cu-based resistive random access memory, including:

performing composition and a chemical combination treatment on a lower copper electrode to generate a compound buffer layer, wherein the compound buffer layer is capable of preventing the oxidation of the lower copper electrode;

depositing a solid electrolyte material and an upper electrode on the compound buffer layer; and performing composition to form the memory.

Optionally, the performing composition and a chemical combination treatment on a lower copper electrode to generate a compound buffer layer includes:

performing composition and a siliconization treatment on the lower copper electrode to generate the compound buffer layer of Cu, Si and N; or performing composition and the siliconization treatment on the lower copper electrode to generate the compound buffer layer of Cu, Ge and N.

Optionally, the thickness of the compound buffer layer of Cu, Si and N or the compound buffer layer of Cu, Ge and N is 1-100 nm.

Optionally, prior to the performing composition and a chemical combination treatment on a lower copper electrode to generate a compound buffer layer, the method further includes:

forming a hole in a dielectric layer on the lower copper electrode to locally expose the lower copper electrode through the pore.

The performing composition and a chemical combination treatment on a lower copper electrode to generate a compound buffer layer is specifically as follows:

performing the siliconization treatment or a germanidation treatment on the exposed lower copper electrode to generate the compound buffer layer.

Optionally, the siliconization treatment or the germanidation treatment is completed by a reaction in a silicon-containing gas or a germanium-containing gas.

Optionally, the siliconization treatment or the germanidation treatment is completed by an ion injection method of silicon or germanium.

Optionally, prior to the performing the siliconization treatment or a germanidation treatment on the exposed lower copper electrode to generate the compound buffer layer, the method further includes:

performing a reduction treatment on the exposed lower copper electrode in a hydrogen-containing gas.

Optionally, the performing the siliconization treatment or a germanidation treatment on the exposed lower copper electrode to generate the compound buffer layer includes:

performing the siliconization treatment on the exposed lower copper electrode to obtain a compound of copper and silicon; and performing a desalination treatment on the compound of copper and silicon in a nitrogen-containing gas to obtain the compound buffer layer of Cu, Si and N; or performing the germanidation treatment on the exposed lower copper electrode to obtain a compound of copper and germanium; and performing a nitrogen treatment on the compound of copper and germanium in the nitrogen-containing gas to obtain the compound buffer layer of Cu, Ge, and N.

The embodiment of the present application further provides a Cu-based resistive random access memory, including:

a lower copper electrode and a dielectric layer, wherein the dielectric layer is arranged above the lower copper electrode, and a pore is formed in the dielectric layer;

a compound buffer layer embedded right below the pore in the lower copper electrode, wherein the compound buffer layer is a compound of Cu, Si and N or a compound of Cu, Ge and N;

a solid electrolyte material arranged above the compound buffer layer and the dielectric layer and arranged in the wall of the pore; and an upper electrode arranged on the solid electrolyte material.

Optionally, the thickness of the compound buffer layer is 1-100 nm.

The abovementioned one or more technical solutions in the embodiment of the present application at least have the following technical effects:

When the Cu-based resistive random access memory is prepared, the compound buffer layer capable of preventing the oxidation of the lower copper electrode is inserted between the lower copper electrode and the solid electrolyte material to efficiently prevent the oxidation of the lower copper electrode in a growth process of the solid electrolyte material, such that an electrode interface does not become rough due to the oxidation, thereby solving the technical problem of relatively low reliability and yield of the device resulting from the rough electrode interface of the Cu-based resistive random access memory in the prior art, and thus the reliability and the yield of the device are improved.

BRIEF DESCRIPTION OF THE DRAWINGS

Various other advantages and benefits will become apparent to those of ordinary skill in the art upon reading the following detailed description of the preferred embodiments. The drawings are only for the purpose of illustrating the preferred embodiments and are not construed as limiting the present invention. Moreover, in the whole drawings, the same reference signs are used for expressing the same components. In the drawings.

DETAILED DESCRIPTION OF THE EMBODIMENTS

Figure 1:
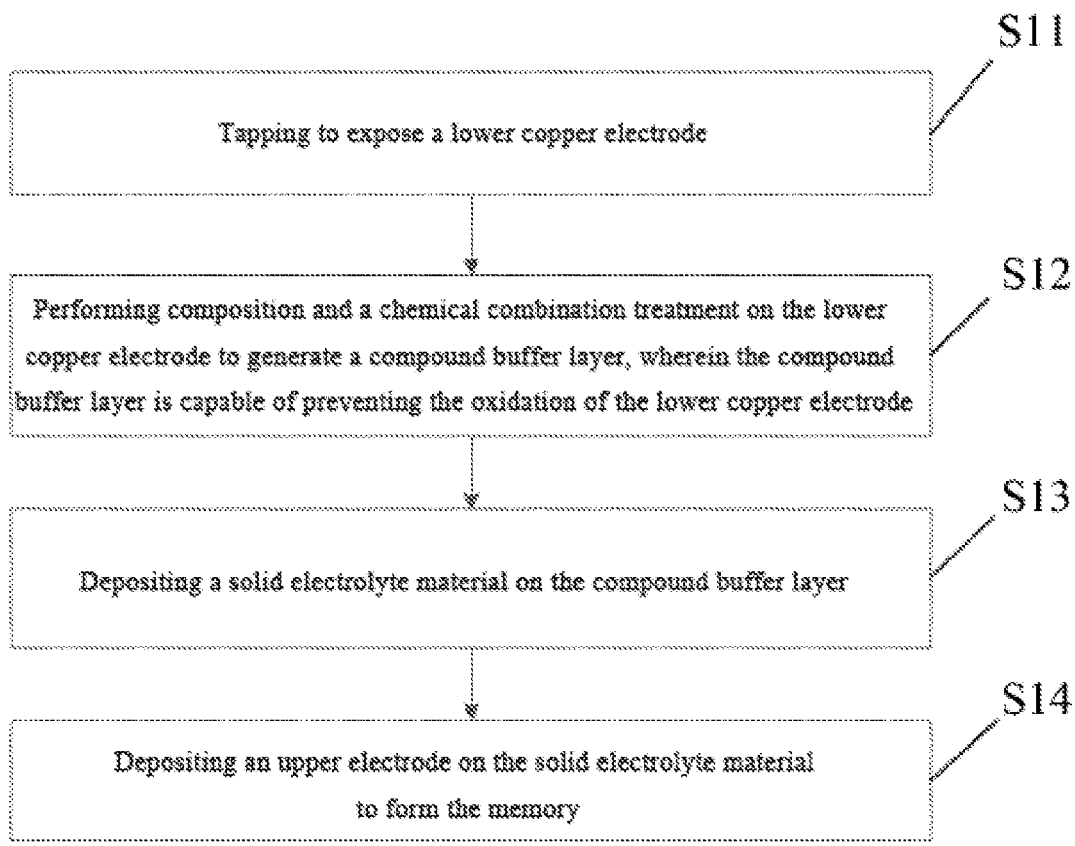
FIG. 1 is a schematic diagram of a preparation method of a Cu-based resistive random access memory provided by an embodiment of the present application.

Hereinafter, exemplary embodiments of the present disclosure will be described below in more detail with reference to the drawings. Although the drawings show the exemplary embodiments of the present disclosure, it should be understood that the present disclosure may be implemented in various forms and should not be limited to the embodiments set forth herein. On the contrary, these embodiments are provided to understand the present disclosure more thoroughly and may fully convey the scope of the present disclosure to those skilled in the art.

The present invention is described more fully in reference embodiments below in combination with the drawings, the present invention provides preferred embodiments, but should not be considered as being limited to the embodiments set forth herein. In the drawings, the thicknesses of layers and areas are amplified for clarity, but should not be considered as strictly reflecting the proportional relation of any geometric sizes as schematic diagrams.

The reference figures herein are schematic diagrams of idealized embodiments of the present invention, the embodiments shown in the present invention should not be construed as being merely limited to the particular shapes of areas illustrated in the figures, but including the obtained shapes, such as manufacturing induced deviation. For example, a curve obtained by dry etching usually has a curved or rounded shape. However, in the drawings of the embodiments of the present invention, all of them are represented by rectangles. The representations in the figures are schematic, but this should not be construed as limiting the scope of the present invention.

Embodiment

Please refer to FIG. 1, the embodiment of the present application provides a preparation method of a Cu-based resistive random access memory, including:

S12: performing composition and a chemical combination treatment on a lower copper electrode to generate a compound buffer layer, wherein the compound buffer layer is capable of preventing the oxidation of the lower copper electrode;

S13: depositing a solid electrolyte material on the compound buffer layer; and

S14: depositing an upper electrode on the solid electrolyte material to form the memory.

In a specific implementation process, in the embodiment of the present application, before the S12 is executed to perform the composition and the chemical combination treatment on the lower copper electrode to generate the compound buffer layer, an earlier stage process S11 of the preparation of the Cu-based resistive random access memory is completed at first.

S11, tapping to expose the lower electrode.

Figure 2:
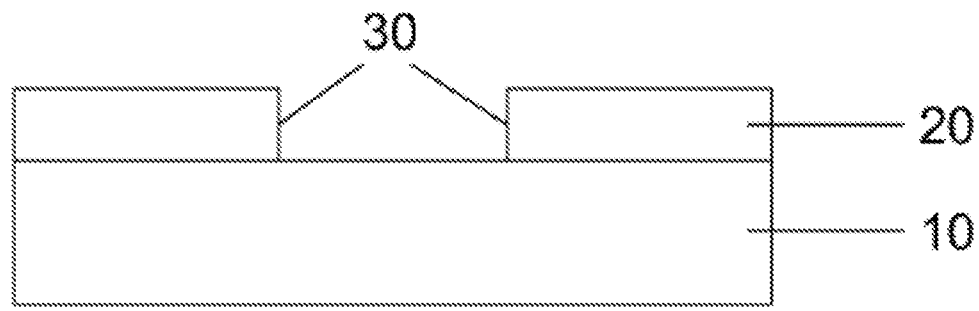
FIG. 2 is a schematic diagram of tapping when a Cu-based resistive random access memory is prepared provided by an embodiment of the present application.

In the step, as shown in FIG. 2, a pore 30 is formed in a dielectric layer 20 on the lower copper electrode 10. The pore 30 is used for locally exposing the lower copper electrode, and thus a siliconization treatment or a germanidation treatment may be performed on the exposed lower copper electrode 10 to generate the compound buffer layer. At the same time, the pore 30 is further used for defining the size of a unit area of a storage dielectric layer, that is, the size of the area of the lower copper electrode exposed from the pore 30 is the size of the unit area of the storage dielectric layer. The dielectric layer 20 may be made of silicon oxide, silicon nitride and other materials, and the pore 30 may be formed in the dielectric layer 20 by a photoetching or an etching method. By means of the step, after the earlier stage process of the preparation of the Cu-based resistive random access memory is completed, S12 is executed.

S12, the composition and the chemical combination treatment are performed on the lower copper electrode to generate the compound buffer layer 40.

In the step, the composition and the siliconization treatment or the germanidation treatment may be performed on the exposed lower copper electrode 10 to generate a CuSiN or CuGeN compound buffer layer 40, wherein CuSiN represents a compound of elements Cu, Si and N, and CuGeN represents a compound of elements Cu, Ge and N. The CuSiN or CuGeN layer may improve the low resistance state resistance of the device, thereby reducing the power consumption of the device. When the CuSiN or CuGeN is prepared, an autoregistration process may be adopted, the compound buffer layer is formed on the lower copper electrode 10 by autoregistration, therefore the preparation cost is low, and the problem of an expanded area of the device resulting from an additional metal insertion layer is avoided.

When the CuSiN or CuGeN compound buffer layer is prepared, the following specific steps may be contained:

Step 1, reduction treatment: performing a reduction treatment on the exposed lower copper electrode 10 in a hydrogen-containing gas to remove a native oxide layer on the Cu surface. The hydrogen-containing gas may be H2, H2O, an H2/N2 mixture, NH3 and the like. During the reduction treatment, the Cu may be exposed to the hydrogen-containing gas at a certain temperature (for example, 200° C.-500° C.), and the process may also be accompanied by the generation of plasma so as to reduce the CuOx on the surface layer to Cu.

Step 2, siliconization treatment or germanidation treatment: the method of siliconization or germanidation mainly includes: performing siliconization in a silicon-containing gas/performing germanidation in a germanium-containing gas; performing a surface treatment via silicon/germanium plasma; and performing a treatment by a silicon/germanium ion injection method.

With siliconization as an example, the following three manners are contained: (1) performing siliconization in a high temperature silicon-containing gas; (2) performing the surface treatment via silicon plasma; and (3) performing siliconization by an ion injection method of silicon. With the siliconization method (1) as an example, the lower copper electrode 10 is partially exposed to the silicon-containing gas at a certain high temperature (e.g., 200° C.-500° C.), the Cu metal chemically reacts with the gas to form a CuSi compound by siliconization. In the embodiment, the silicon-containing gas may be SiH4, SiH2Cl2, Si (CH3)4 and other gases, and the constant pressure of the chemical reaction is less than 20 Torr. The chemical reaction may be implemented in a silane (SiH4) atmosphere at a temperature of 100° C.-500° C. and a silane concentration of 0.01%-30% under a heating condition. In the method (3), during the ion injection of silicon, the dielectric layer 20 functions as a mask layer at the same time, and the thickness range of the formed CuSi compound is 0.5-500 nm. It should be noted that CuSi does not represent a fixed chemical formula of the compound, and the stoichiometric ratio of copper to silicon is not merely limited to 1:1, the stoichiometric ratio is related to the formed process parameters, such as gas flow, temperature, time and the like. Similarly, the thickness range of a CuGe compound obtained from the germanidation treatment may also be 0.5 nm-500 nm, the CuGe also does not represent the fixed chemical formula of the compound, the stoichiometric ratio of copper to germanium is not merely limited to 1:1, and the stoichiometric ratio is related to the formed process parameters, such as gas flow, temperature, time and so on.

Step 3, nitrogen treatment: after the siliconization or germanidation is completed, the CuSi or CuGe compound may be further exposed to a nitrogen-containing gas for nitrogen treatment at a certain temperature (e.g., 100° C.-500° C.) to generate the CuSiN or CuGeN layer so as to form the compound buffer layer 40. The nitrogen-containing gas may be N2, NH3 and the like, the process may also be accompanied by the generation of plasma, the CuSiN or CuGeN compound buffer layer 40 is finally generated, and the thickness of the compound buffer layer may be 1-100 nm.

After the preparation of the compound buffer layer 40 is completed by the above steps 1 to 3, S13 is further executed.

S13, the solid electrolyte material 50 is formed on the CuSiN or CuGeN compound buffer layer 40.

Figure 3:
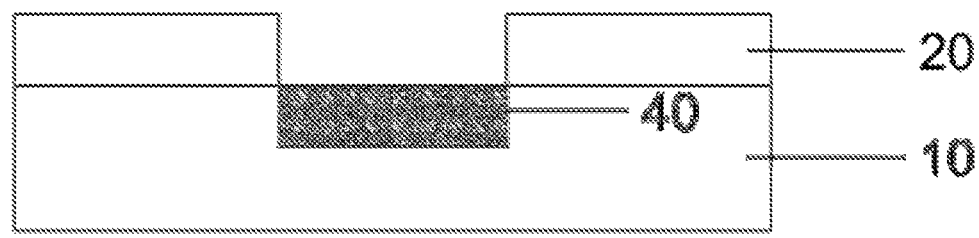
FIG. 3 is a schematic diagram of a chemical combination treatment when a Cu-based resistive random access memory is prepared provided by an embodiment of the present application.
Figure 4:
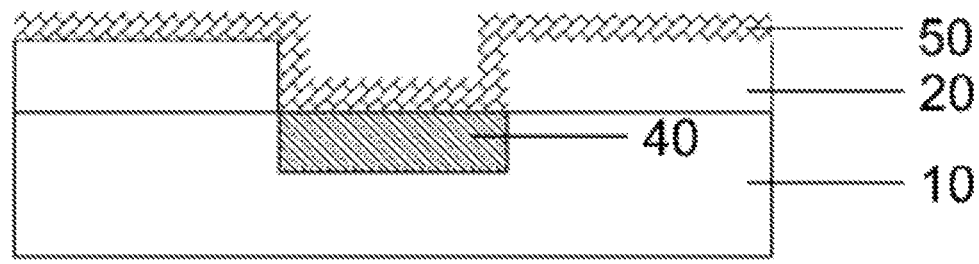
FIG. 4 is a schematic diagram of generating a solid electrolyte material when a Cu-based resistive random access memory is prepared provided by an embodiment of the present application.

In the step, the structure as shown in FIG. 4 is formed by depositing the solid electrolyte material 50 (such as GeS, TaOx, HfOx, AlOx or the like) on the structure as shown in FIG. 3. The embodiment of the present application does not limit the category or the deposition method of the solid electrolyte material 50.

S14, the upper electrode 60 is deposited on the solid electrolyte material 50 to form the memory.

Figure 5:
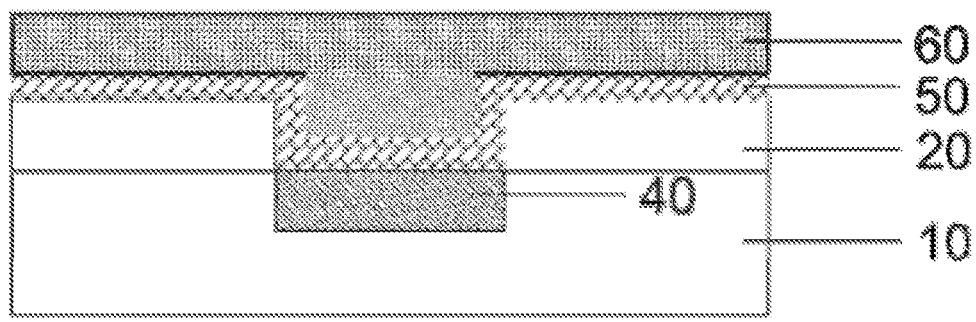
FIG. 5 is a schematic diagram of generating an upper electrode when a Cu-based resistive random access memory is prepared provided by an embodiment of the present application.

In the step, a metal conductive material (e.g., Ta, Ti, TaN and the like) may be deposited on the structure as shown in FIG. 4 by PVD (Physical Vapor Deposition, which refers to realizing substance transfer via a physical process) to serve as the upper electrode 60 to cover the solid electrolyte material 50 so as to from the Cu-based resistive random access memory as shown in FIG. 5. The embodiment of the present application also does not limit the metal material type or the deposition method of the upper electrode 60.

So far, the preparation process of the Cu-based resistive random access memory as shown in FIG. 1 is completed.

Based on the above-mentioned preparation method of the Cu-based resistive random access memory, the embodiment of the present application correspondingly provides a Cu-based resistive random access memory, and as shown in FIG. 5, the memory includes:

a lower copper electrode 10 and a dielectric layer 20, wherein the dielectric layer 20 is arranged above the lower copper electrode 10, and a pore is formed in the dielectric layer 20;

a compound buffer layer 40 embedded right below the pore in the lower copper electrode 10, wherein the compound buffer layer 40 is a compound of Cu, Si and N or a compound of Cu, Ge and N;

a solid electrolyte material 50 arranged above the compound buffer layer 40 and the dielectric layer 20 and arranged on the inner side of the wall of the pore; and an upper electrode 60 arranged on the solid electrolyte material 50.

The thickness of the compound buffer layer 40 is 1-100 nm, and the compound buffer layer is used for effectively preventing the oxidation of the Cu electrode during the growth of the solid electrolyte material 50 and improving the reliability and yield of the device.

By means of one or more embodiments of the foregoing technical solutions, at least the following technical effects are achieved:

1) The CuSiN compound or CuGeN compound buffer layer is inserted between the Cu electrode and the solid electrolyte material to effectively avoid the oxidation of the Cu electrode during the growth of the solid electrolyte material and improve the reliability and the yield of the device.

2) The CuSiN or CuGeN is formed on the Cu electrode by autoregistration, so that the preparation cost is low, and the problem of the expanded area of the device resulting from the additional metal insertion layer is avoided.

3) The CuSiN or CuGeN layer may improve the low resistance state resistance of the device, thereby reducing the power consumption of the device.

In the description provided herein, numerous specific details are set forth. However, it may be understood that the embodiments of the present invention may be practiced without these specific details. In some instances, well-known methods, structures and techniques have not been shown in detail in order not to obscure the understanding of the description.

Similarly, it should be understood that in the foregoing description of the exemplary embodiments of the present invention, in order to simplify the present disclosure and help to understand one or more of the various inventive aspects, various features of the present invention are sometimes grouped together into single embodiments, figures or descriptions thereof. However, the method of the present disclosure should not be construed as reflecting the following intention: the claimed invention claims more features than the features that are specifically recited in each of the claims. Or rather, as the following claims reflect, the inventive aspects lie in less than all the features of a single foregoing disclosed embodiment. Thus, the claims following the detailed description are hereby expressly incorporated into the detailed description, wherein each claim is used as a single embodiment of the present invention.

Those skilled in the art may understand that although some of the embodiments described herein include some but not other features included in other embodiments, combinations of features of different embodiments are meant to be within the scope of the present invention and form different embodiments. For example, in the following claims, any one of the claimed embodiments may be used in any combination manner.

The invention claimed is:

1. A preparation method of a Cu-based resistive random access memory, comprising:
    forming a hole in a dielectric layer on a lower copper electrode to locally expose the lower copper electrode through the hole;
    performing composition and a chemical combination treatment on the lower copper electrode to generate a homogenous compound buffer layer comprising either CuSiN or CuGeN at a bottom of the hole in the dialectic layer, wherein the homogenous compound buffer layer is embedded in the lower copper electrode and is configured to prevent oxidation of the lower copper electrode;
    depositing a solid electrolyte material comprising at least one of GeS, TaOx, HfOx, and AlOx on the homogenous compound buffer layer; and
    depositing an upper electrode comprising at least one of Ta, Ti, TaN on the solid electrolyte material to form the Cu-based resistive random access memory.

2. The method of claim 1, wherein the thickness of the homogenous compound buffer layer of Cu, Si and N or the homogenous compound buffer layer of Cu, Ge and N is 1-100 nm.

3. The method of claim 1, wherein prior to the performing composition and a chemical combination treatment on a lower copper electrode to generate a homogenous compound buffer layer, the method further comprises:
    the performing composition and a chemical combination treatment on a lower copper electrode is specifically as follows:
    performing a siliconization treatment or a germanidation treatment on the exposed lower copper electrode to generate the homogenous compound buffer layer.

4. The method of claim 3, wherein the siliconization treatment is completed by a reaction in a silicon-containing gas; or the germanidation treatment is completed by the reaction in a germanium-containing gas.

5. The method of claim 3, wherein the siliconization treatment is completed by an ion injection method of silicon; or the germanidation treatment is completed by the ion injection method of germanium.

6. The method of claim 3, wherein prior to the performing the siliconization treatment or the germanidation treatment on the exposed lower copper electrode to generate the homogenous compound buffer layer, the method further comprises:
    performing a reduction treatment on the exposed lower copper electrode in a hydrogen-containing gas.

7. The method of claim 3, wherein the performing the siliconization treatment or the germanidation treatment on the exposed lower copper electrode to generate the homogenous compound buffer layer comprises:
    performing the siliconization treatment on the exposed lower copper electrode to obtain a compound of copper and silicon; and performing a desalination treatment on the compound of copper and silicon in a nitrogen-containing gas to obtain the homogenous compound buffer layer of Cu, Si and N; or
    performing the germanidation treatment on the exposed lower copper electrode to obtain a compound of copper and germanium; and performing a nitrogen treatment on the compound of copper and germanium in the nitrogen-containing gas to obtain the homogenous compound buffer layer of Cu, Ge, and N.

8. The method of claim 1, wherein prior to the performing composition and a chemical combination treatment on a lower copper electrode to generate a homogenous compound buffer layer, the method further comprises:
    the performing composition and a chemical combination treatment on a lower copper electrode is specifically as follows:
    performing the siliconization treatment or a germanidation treatment on the exposed lower copper electrode to generate the homogenous compound buffer layer.

9. The method of claim 2, wherein prior to the performing composition and a chemical combination treatment on a lower copper electrode to generate a homogenous compound buffer layer, the method further comprises:
    the performing composition and a chemical combination treatment on a lower copper electrode is specifically as follows:
    performing the siliconization treatment or a germanidation treatment on the exposed lower copper electrode to generate the homogenous compound buffer layer.

* * * * *